United States Patent
Kariyazaki et al.

(10) Patent No.: US 7,363,092 B2
(45) Date of Patent: Apr. 22, 2008

(54) MULTI-JOINT ROBOT AND CONTROL DEVICE THEREOF

(75) Inventors: Hirokazu Kariyazaki, Fukuoka (JP); Tatsumi Nakazato, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 565 days.

(21) Appl. No.: 10/516,453

(22) PCT Filed: May 26, 2003

(86) PCT No.: PCT/JP03/06556

§ 371 (c)(1),
(2), (4) Date: Dec. 3, 2004

(87) PCT Pub. No.: WO03/101676

PCT Pub. Date: Dec. 11, 2003

(65) Prior Publication Data

US 2005/0204848 A1  Sep. 22, 2005

(30) Foreign Application Priority Data

Jun. 4, 2002 (JP) ............................. 2002-163511

(51) Int. Cl.
*G05D 1/00* (2006.01)
*G06F 19/00* (2006.01)
*B25J 9/18* (2006.01)

(52) U.S. Cl. ...................... 700/1; 700/245; 318/568.11
(58) Field of Classification Search .................... 700/1, 700/61, 64, 245–252; 318/568.11, 568.21, 318/568.12, 568.17

See application file for complete search history.

(56) References Cited

U.S. PATENT DOCUMENTS

| | | | | |
|---|---|---|---|---|
| 3,890,552 | A | * | 6/1975 | Devol et al. ............ 318/568.14 |
| 6,121,743 | A | * | 9/2000 | Genov, deceased et al. ...................... 318/568.11 |
| 2003/0171847 | A1 | * | 9/2003 | Cheng et al. ................ 700/245 |
| 2004/0228719 | A1 | * | 11/2004 | Woodruff et al. ......... 414/744.5 |

FOREIGN PATENT DOCUMENTS

| | | |
|---|---|---|
| JP | 60-27906 A | 2/1985 |
| JP | 3-71887 U | 7/1991 |
| JP | 2000-190258 A | 7/2000 |
| KR | 2000-0014795 | 3/2000 |

* cited by examiner

*Primary Examiner*—Zoila Cabrera
(74) *Attorney, Agent, or Firm*—Sughrue Mion, PLLC

(57) ABSTRACT

It is an object of the invention to provide an articulated robot capable of reducing a number of axes, making the robot light-weighted, reducing fabrication cost and promoting a working efficiency by mounting two or more of hands at a single unit of the robot and sharing portions of axes and its control apparatus. For that purpose, an articulated robot having a plurality of hands at a single unit thereof capable of sharing portions of axes (first axis, second axis) and attaching the hands respectively to tips of a plurality of axes (4A axis, 4B axis) connected to the axes (first axis, second axis) independently therefrom is provided with a control apparatus for subjecting a designated one of the hands to a CP control and switching the hand which is not designated to a PTP control.

4 Claims, 8 Drawing Sheets

① TAKE OUT WORKED WORK FROM WORK STATION

② · INPUT UNWORKED WORK TO WORK STATION
→→→ START WORKING

③ · CARRY OUT WORKED WORK TO CARRY OUT STATION

④ · TAKE OUT UNWORKED WORK (OF NEXT TIME) FROM CARRY IN STATION

MOVJ C000
··· PTP CONTROL TO THE ATTITUDE

MOVL C001 FRG=1
··· LINEAR INTERPOLATE ON SIDE OF FIRST FLANGE
PTP CONTROL ON SIDE OF SECOND FLANGE

MULTI-JOINT ROBOT AND CONTROL DEVICE THEREOF

TECHNICAL FIELD

The present invention relates to an articulated robot mounted with a plurality of tools at a single unit thereof and a control apparatus of the same.

BACKGROUND ART

It is ordinary that a normal articulated robot is provided with only one tool. FIG. 7 is an outline view showing a general axis constitution of a handling robot of a background art. In order to arbitrarily determine a three-dimensional position and an attitude in one plane of a tool, a minimum of 4 axes of a first axis through a fourth axis are needed in this way The robot can mount a single tool at the fourth axis.

FIG. 8 is an outline view of a work working system comprising a carry in station, a work station, a carry out station, and a handling robot. An unworked work is carried in to the carry in station 1. The work station 2 works the inputted work. The carry out station 3 carries out the worked work. The tool 5 of the handing robot 4 serves to handle to deliver the work among the respective stations.

FIG. 9 is an explanatory view of an example of operation of the robot in one cycle when the single unit of the robot as shown by FIG. 7 carries a single tool in the work working system of FIG. 8. In this case, the operation is realized by, a cycle of first, ① the worked work 6 is taken out from the work station 2, ② the worked work 6 is carried out to the carry out station 3 and thereafter, ③ an unworked work 7 is taken out from the carry in station 1, and ④ the unworked work 7 is inputted to the work station 2.

Although it is ordinary that an articulated robot of a background art carries only one tool, when one unit of a robot is mounted with two or more of tools to control independently from each other, a working efficiency is promoted.

However, when positions and attitudes in one plane of two tools are going to be controlled respectively by one unit of the robot, 4 axes×2=8 axes are needed when a simple consideration is given thereto. However, according thereto, there poses a problem that the robot becomes enlarged and heavy and also fabrication cost is increased.

DISCLOSURE OF THE INVENTION

Hence, it is an object of the invention to provide an articulated robot capable of reducing a number of axes, making the robot light-weighted, reducing fabrication cost and promoting a working efficiency by mounting two or more of tools to a single unit of the robot and sharing portions of the axes and its control apparatus.

In order to resolve the above-described problem, there is provided with an articulated robot including a plurality of tools at a single unit thereof sharing portions of axes and capable of attaching the tools respectively to tips of a plurality of axes connected to the axes independently therefrom, and a control apparatus for subjecting a designated one of the tools to an interpolate control while controlling a position thereof or controlling a position and an attitude thereof and subjecting the tool which is not designated to a uniform pay off control to instruct to an axis angle of a target position.

Further, there is provided with a control apparatus of the articulated robot, the control apparatus including a member for acquiring information in correspondence with an angle of each axis as the target position, a member for selecting one of the plurality of tools as an object of the interpolate control while controlling the position or controlling the position and the attitude, a member for determining a passing point at which the selected tool is to be moved successively by the interpolate control, a member for determining each axis position for moving a control point of the selected tool to the determined passing point by an inverse conversion operation, and a member for subjecting the axis which is unrelated to moving the control point of the selected tool to the uniform pay off control to instruct to the axis angle of the target position.

Further, there is provided with the control apparatus of the articulated robot further including a member for preventing an operation instruction from being generated with regard to the axis which is unrelated to moving the control point of the selected tool.

BEST MODE FOR CARRYING OUT THE INVENTION

Figure 1:
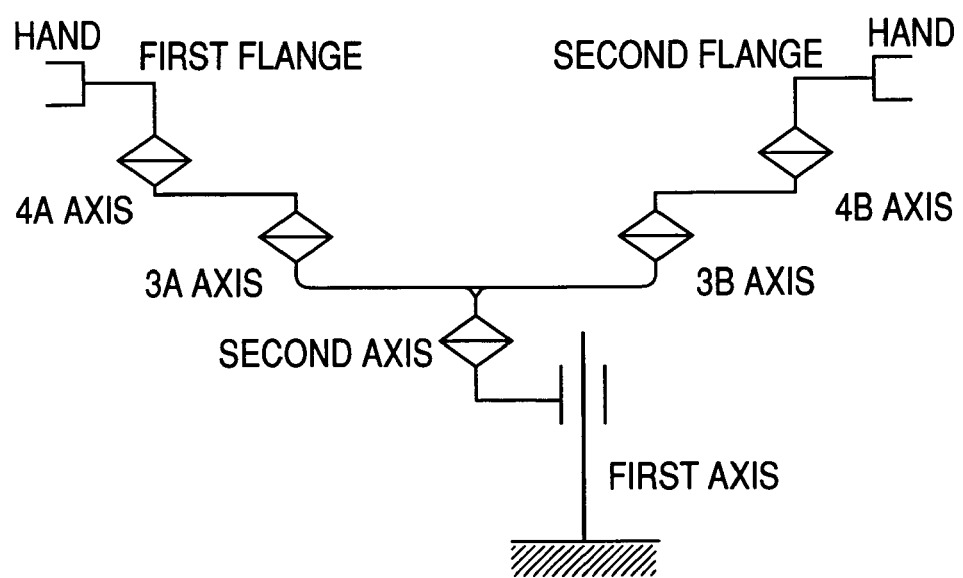
FIG. 1 shows an example of an axis constitution of a handling robot according to the invention.
Figure 7:
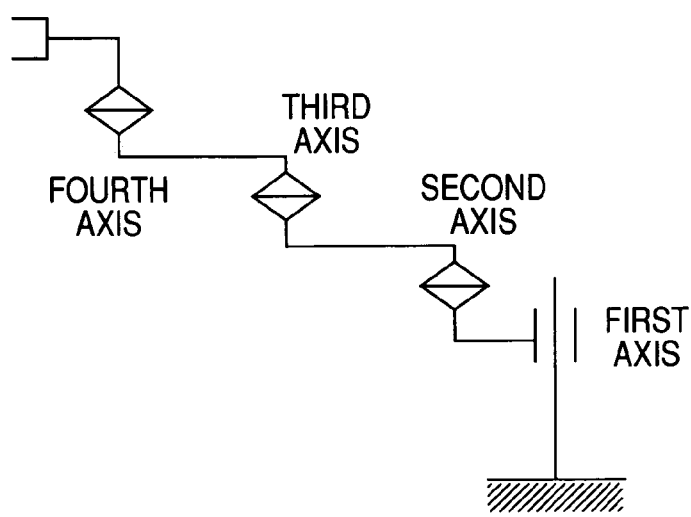
FIG. 7 is an outline view showing a general axis constitution of a handling robot of a background art.

FIG. 1 is a view showing an example of an axis constitution of an articulated robot capable of mounting two tools by one unit thereof according to the invention. Although when two units of the robots of the background art shown in FIG. 7 are prepared, a number of axes becomes 8 axes of 4×2, a total of the articulated robot of the invention shown in FIG. 1 can be constituted by 6 axes by sharing a first axis and a second axis in this way. Flanges mounted with tools are respectively defined as a first flange and a second flange. A 3A axis and a 3B axis respectively correspond to a third axis of the robot of the background art shown in FIG. 7 and a 4A axis and a 4B axis respectively correspond to a fourth axis thereof.

A side of the first flange comprises the first axis, the second axis, the 3A axis and the 4A axis and can be regarded to be controlled equivalently by the 4 axes robot of the background art shown in FIG. 7, and also a side of the second flange can be regarded to be controlled by the first axis, the second axis, the 3B axis and the 4B axis similarly. By using the robot shown in FIG. 1 in this way, a handling system by the robot having two tools at a single unit thereof can be constructed.

Figure 2:
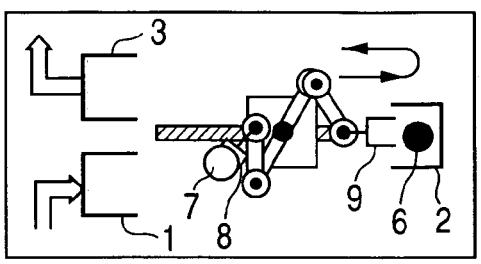
FIG. 2 illustrates views showing operation in one cycle of the handling robot mounted with two tools.
Figure 2:
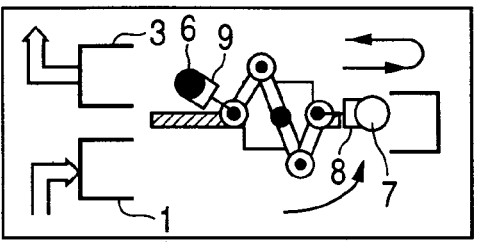
Figure 2:
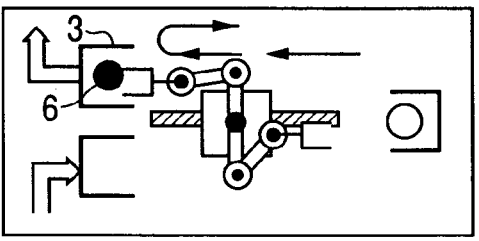
Figure 2:
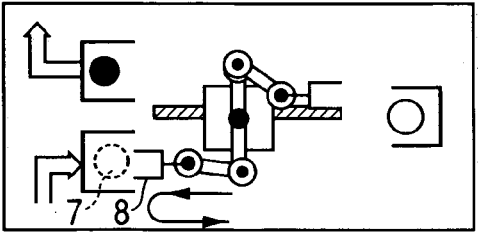
Figure 8:
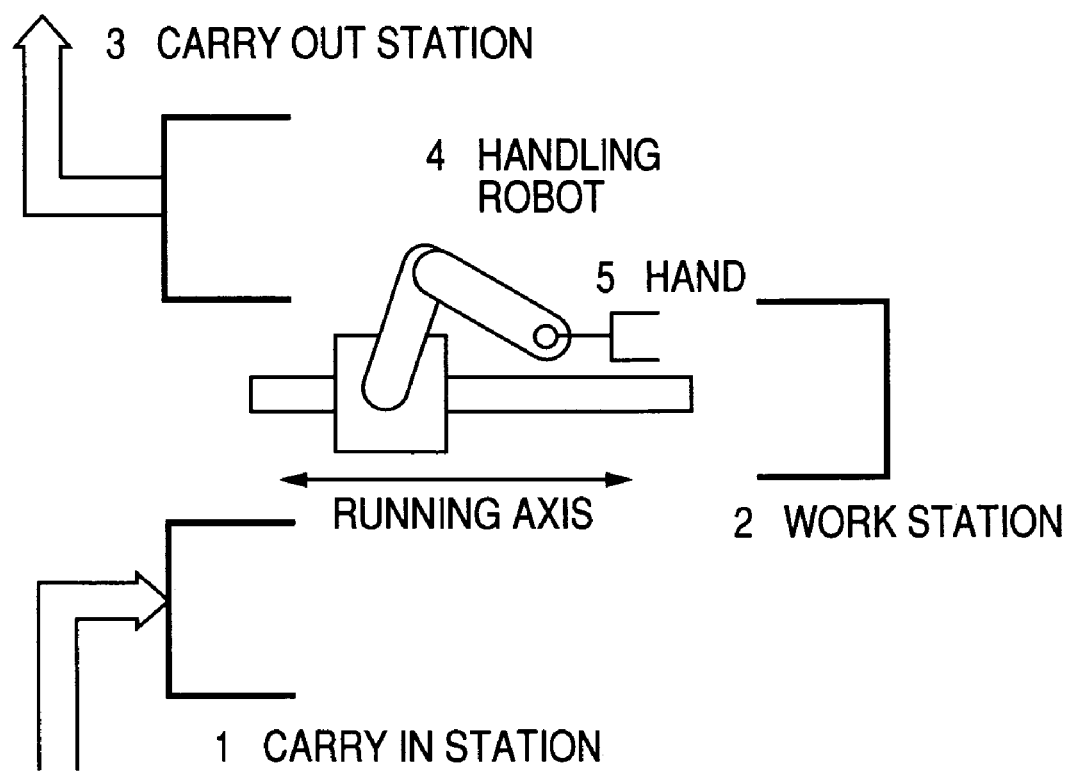
FIG. 8 is an outline view showing an example of a work working system comprising a carry in station, a working station, a carry out station, and a handling robot.

FIG. 2 illustrates views showing operation of the robot in one cycle when two tools are provided to a single unit of the robot shown in FIG. 1 in the work working system of FIG. 8 and respectives thereof can be controlled independently from each other and members the same as those of FIG. 8 are attached with the same notations.

In FIG. 2, there can be realized a cycle in which the robot moves to the work station 2 in a state of grabbing the unworked work 7 at one tool 8, ① takes out the worked work 6 by other tool 9, thereafter, ② successively inputs the unworked work 7 to the work station 2 by one tool 8, and ③ carries out the worked work 6 to the carry out station 3. ④ The robot grabs the unworked work, 7 by one tool 8 at next cycle and returns to operation of ①.

Figure 9:
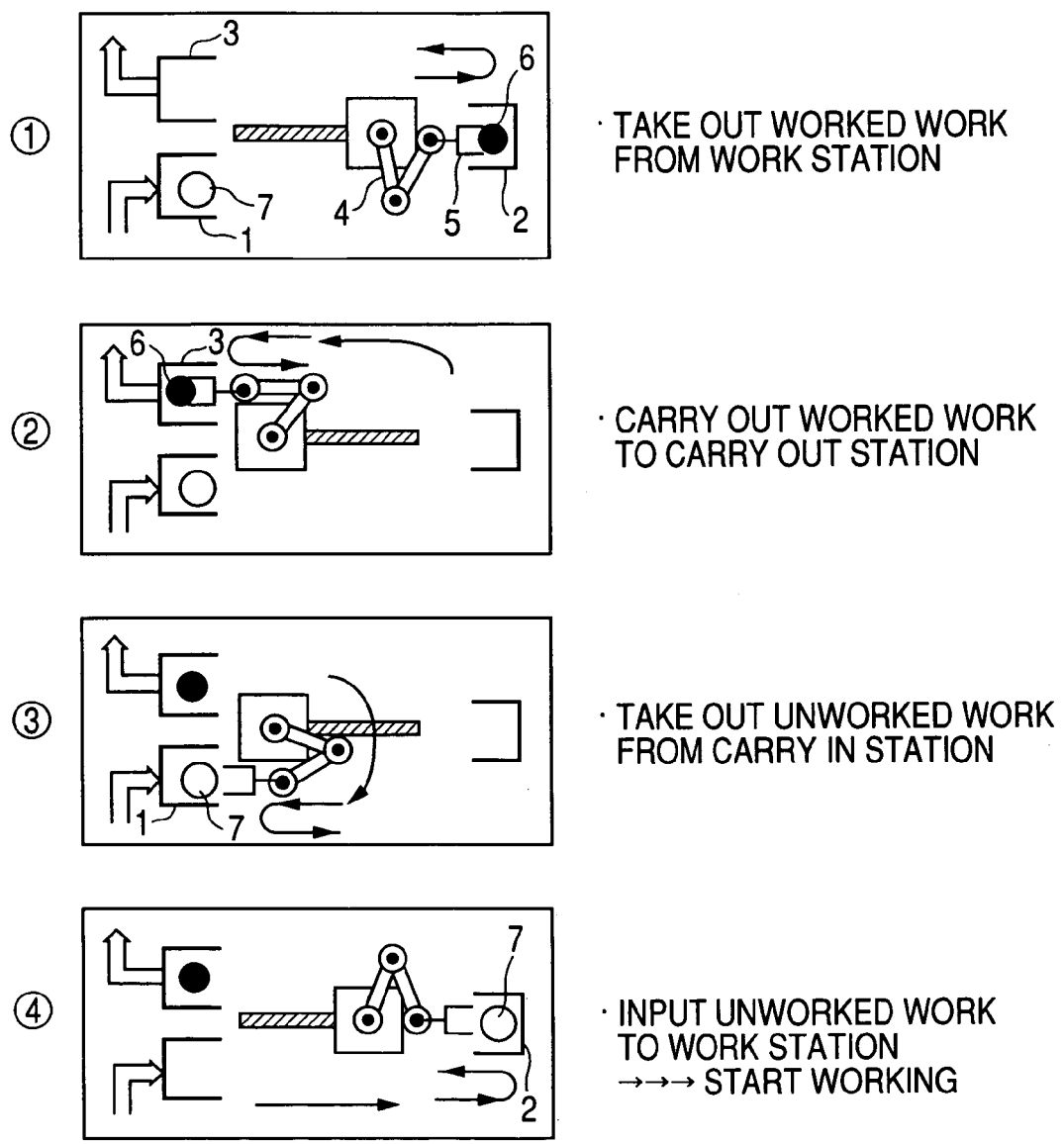
FIG. 9 illustrates explanatory views of an example of operation in one cycle of the robot shown in FIG. 7 in the work working system of FIG. 8.

According to the system of the invention of FIG. 2, in comparison with the system of the background art of FIG. 9 in which the work is worked from step of ④, the work can be started to work from step of ②, the worked work can be carried out and a next work can be prepared to carry in working the work and therefore, cycle time can be shortened.

Meanwhile, in order to accurately carry in/carry out the work in such a handling system, there is needed a so-to-speak CP control for controlling a position and an attitude of the tool such as linear interpolation. However, in the case of constituting axes as shown by FIG. 1, the first axis and the second axis are shared and therefore, both of the two tools cannot be subjected to the CP control simultaneously. Therefore, when such an interpolate control of the robot is operated by a so-to-speak PTP control of paying off respective axes of the robot uniformly to target angles, positions of installing the robot and the station are restricted.

Hence, according to the invention, in the robot for controlling a plurality of the tools, only a selected tool constitutes an object of the CP control and therefore, by selecting a tool on a side of executing an operation which needs the interpolate control in accordance with a situation, a plurality of tools can effectively be utilized by the robot of a minimum axis constitution.

For example, in a system of repeating to carry in/carry out the work as described above, by providing the two tools to the robot of FIG. 1 and switching the control to execute the CP control by a side of the tool for carrying in or carrying out the work to or from the station, operation equivalent to that of 4 axes robot×2 units can be realized by the robot of 6 axes.

Figure 3:
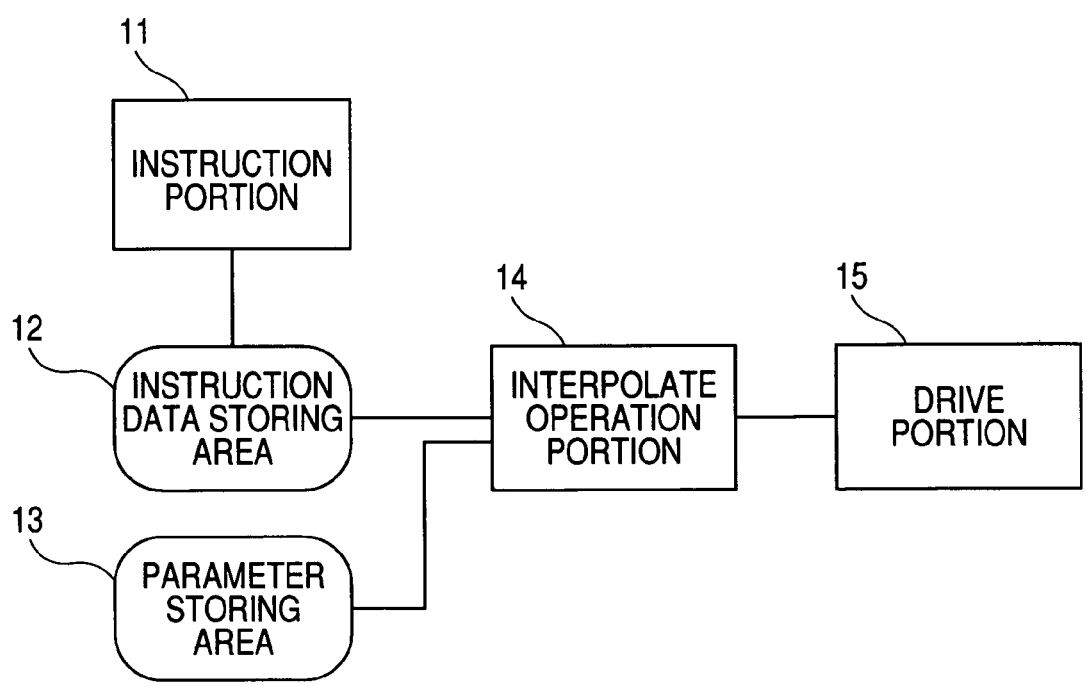
FIG. 3 is a block diagram showing an embodiment of a system for embodying a control of the robot according to the invention.

FIG. 3 is a block diagram showing an embodiment of a system for embodying a control of the robot according to the invention. In FIG. 3, numeral 11 designates an instruction portion, numeral 12 designates an instruction data storing area, numeral 13 designates a parameter storing area, numeral 14 designates an interpolate operation area, and numeral 15 designates a drive portion.

An example of instruction data stored to the instruction data storing area 12 is shown below.
START
MOVJ C000
MOVL C001FRG=1 TOOL=3
MOVL C002FRG=1 TOOL=3
MOVJ C003
MOVL C004FRG=2 TOOL=4
MOVL C005FRG=2 TOOL=4
MOVJ C006
END Here, notation MOVJ designates a movement instruction indicating to operate to a target point by the PTP control, and notation MOVL designates a movement instruction indicating to operate to the target point by the CP control. Notations C000 through C006 designate indexes indicating respective axes angle information at the target point in the respective movement instructions, thereby, angles of respective axes at the target point of the respective movement instructions can be provided. Numeral designated by notation FRG designates a flange number constituting an object of the interpolate control. A numeral indicated by notation TOOL designates a tool file number to constitute an index to a tool file indicating positions from a flange to each tool control point and an attitude of tool coordinates.

As other example, there is also a method in which FRG is not designated with regard to instruction data but each flange number is related to a tool file number designated by TOOL.

Figure 4:
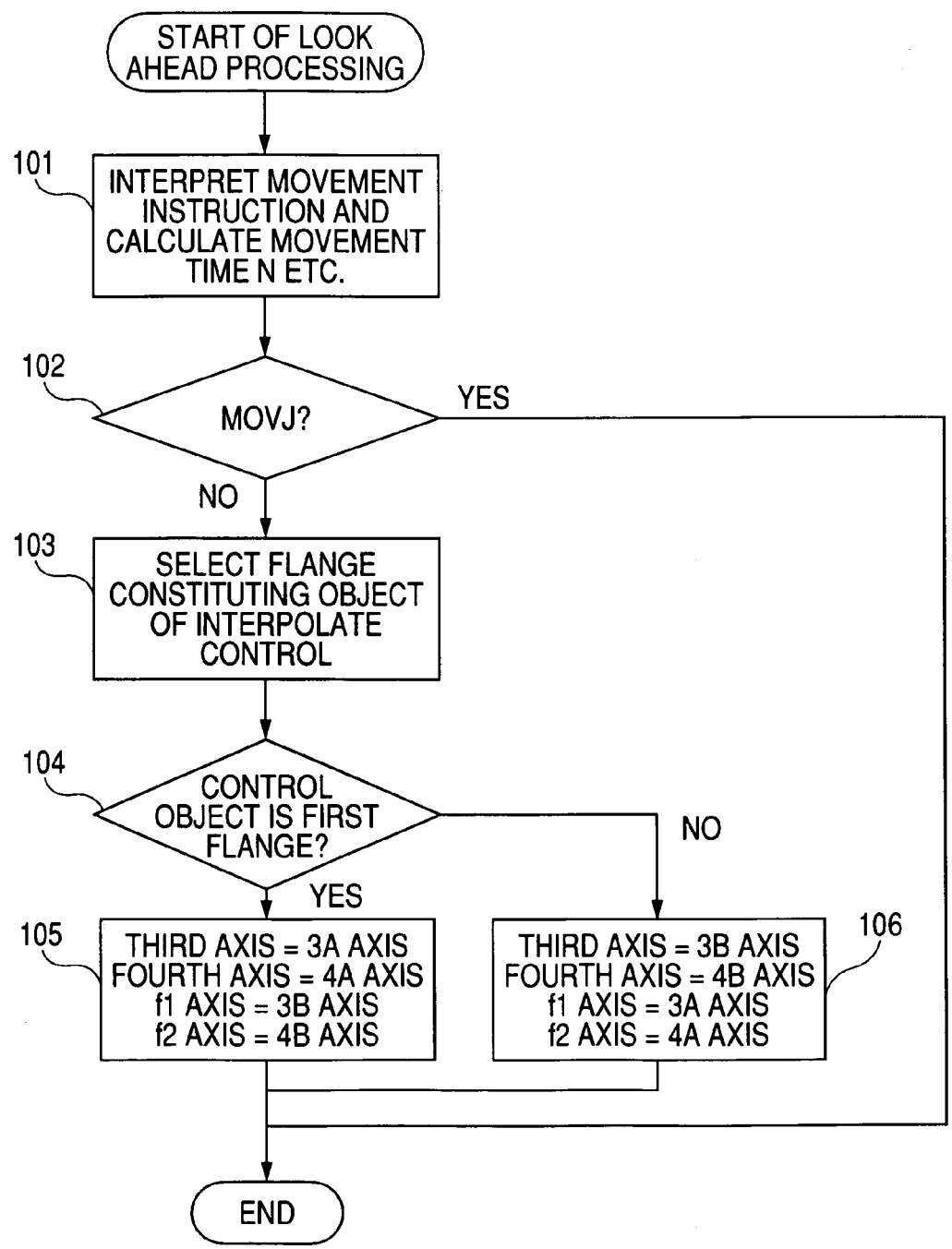
FIG. 4 shows an example of a flow chart with regard to a look ahead processing in processings of an interpolate control method according an embodiment of the invention.
Figure 5:
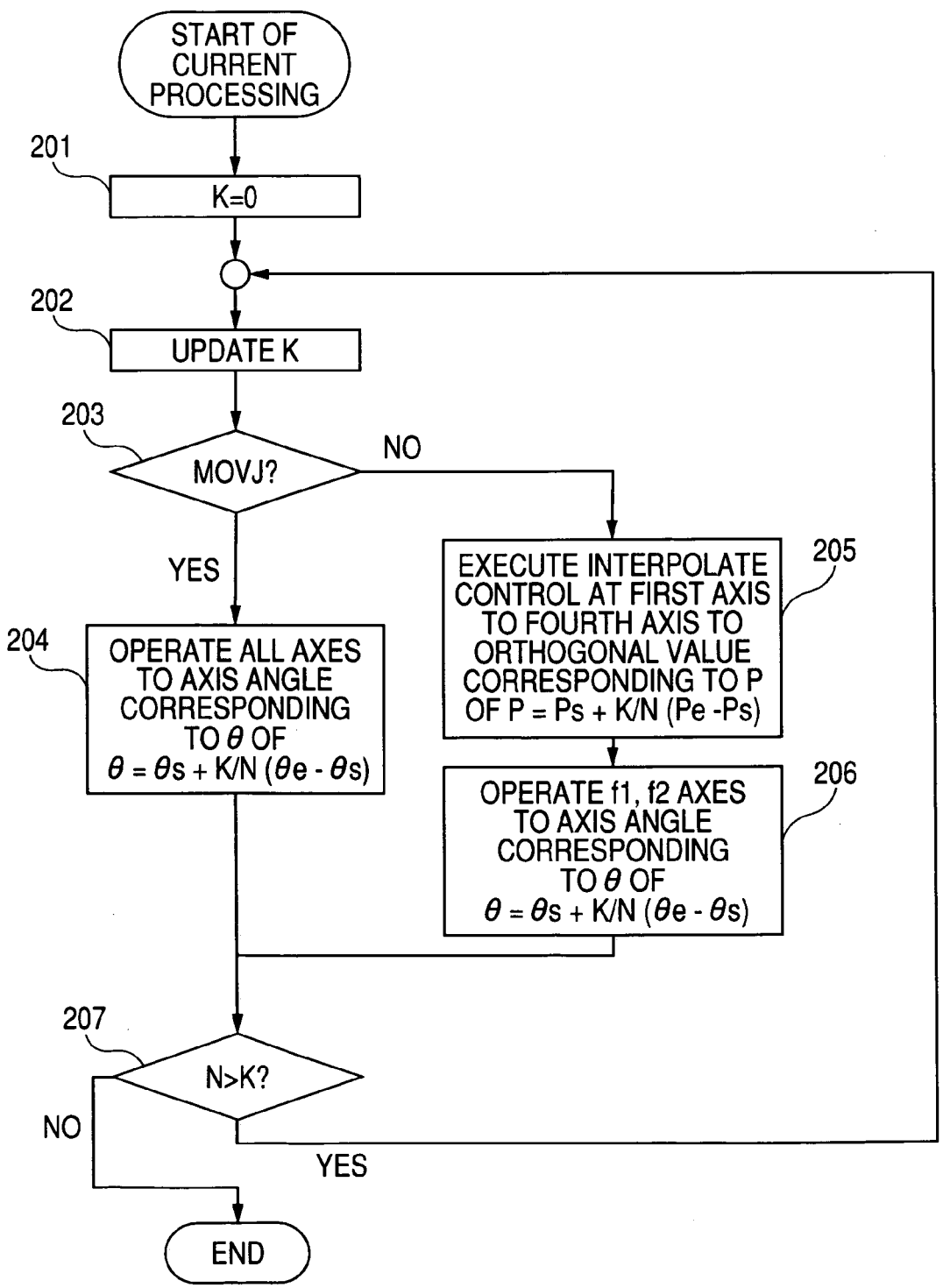
FIG. 5 shows an example of a flowchart with regard to a current processing in the processings of the interpolate control method according to the embodiment of the invention.

FIG. 4 and FIG. 5 show an example of flowcharts with regard to processings of an interpolate control method according to the invention at the interpolate operation portion 14 shown in FIG. 3 and numerals of 101 through 106 and numerals 201 through 207 designate step numbers.

The processings are grossly classified into two processings. That is, a "look ahead processing" shown in FIG. 4 and a "current processing" shown in FIG. 5.

The look ahead processing is processed before actually operating the robot, and information necessary for movement is stored to an inner storing area, not illustrated.

The current processing is a processing of generating an instruction for actually operating the robot while subjecting the robot to the interpolate control and is processed at each operation period.

<Look Ahead Processing>

Step 101: read movement instruction information from the instruction data storing area 12 to calculate necessary movement time and accelerating and decelerating time. The movement time is calculated as a number of times of operation period when acceleration and deceleration are not carried out and is set to a division number N.

Step 102: determine whether movement instruction is MOVJ and when movement instruction is MOVJ, the processing is finished. Otherwise (interpolate instruction of MOVL or the like), the processing is shifted to step 103.

Step 103: confirm a flange constituting an object of the interpolate control. The flange to be selected is read from instruction data stored to the instruction data storing area 12.

Step 104: shift execution to step 105 when the control object flange selected at step 103 is the first flange. Shift execution to step 106 when the control object flange is the second flange.

Step 105: correspond the 3A axis as the third axis and the 4A axis as the fourth axis, correspond the 3B axis, the 4B axis respectively as an f1 axis, f2 axis (uniform pay off control axes) and a control flange number=1 to finish operation.

Step 106: correspond the 3B axis as the third axis and the 4B axis as the fourth axis, correspond the 3A axis, the 4A axis respectively as the f1 axis, the f2 axis, and the control flange number=2 to finish operation.

<Current Processing>

Step 201: clear parameter (K) indicating an advancement degree on an interpolate path to 0.

Step 202; update K. Speed and acceleration and deceleration are controlled by a way of updating K. For example, when K is increased respectively by 1, equal speed movement at instruction speed is constituted. When K is increased such that 0.2, 0.4, 0.6, . . . an equal acceleration movement is constituted.

Step 203; determine whether movement instruction is MOVJ, when movement instruction is MOVJ, the processing is shifted to step 204 and otherwise (interpolate instruction of MOVL or the like), the processing is shifted to step 205.

Step 204: operate all axes to an axis angle corresponding to θ of θ=θs+K/N (θe−θs). Here, θs: axis angle at start point, θe=axis angle at end point. Thereafter, the processing is shifted to step 207.

Step 205: calculate orthogonal position corresponding to P (target position at current operation period) of P=Ps+K/N (Pe−Ps) and calculate respective axis angles of the first axis through the fourth axis to bring a control point of a flange indicated by a control flange number to P by inverse conversion. Here, Ps: start point position, Pe: end point position. Thereafter, the processing is shifted to step 206.

Step 206: operate the f1 axis and the f2 axis to axis angle corresponding to θ of θ=θs+K/N (θe−θs). Thereafter, the processing is shifted to step 207.

Step 207: compare movement time: N and K. When N>K, jump to step 202. When N≦K, the processing is finished.

In this way, by substituting the axis constituting the object of the interpolate control in accordance with the selected flange, the interpolate control can be carried out with regard to either of the first flange and the second flange.

Figure 6:
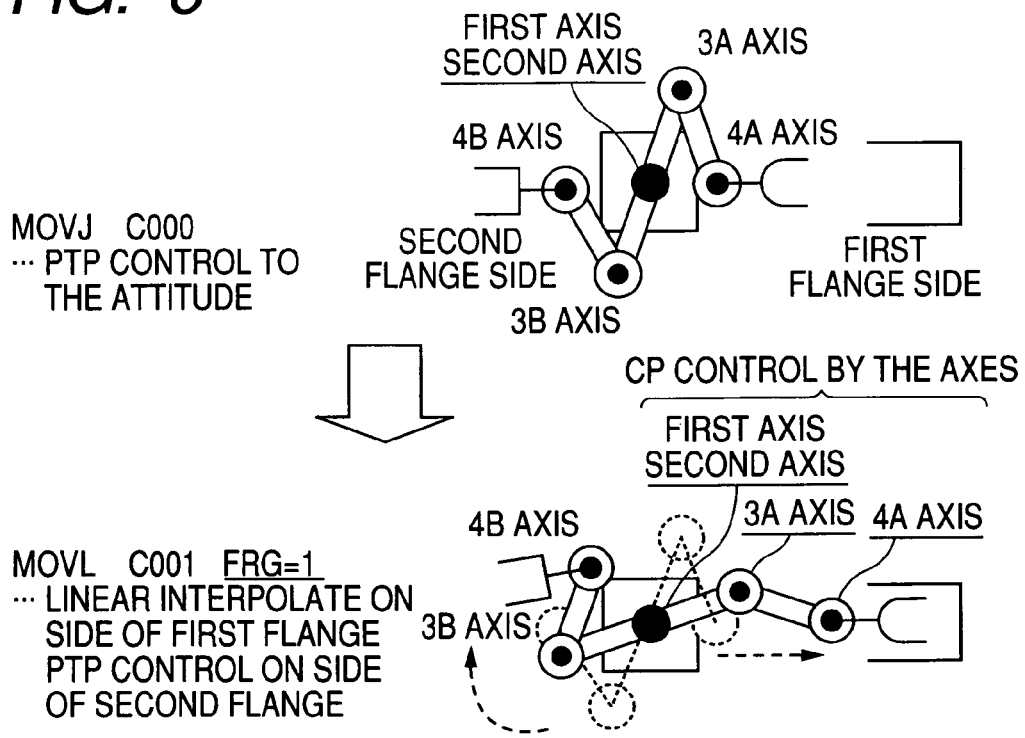
FIG. 6 shows an example of operation of a robot in one cycle in a work working system of FIG. 8 when the robot is mounted with two tools.

FIG. 6 shows a behavior of operation of the robot when the robot of FIG. 1 is controlled by using the processing.

Here, in order to input the work straightly to the work station, the linear interpolate control is needed with regard to the side of the first flange.

Instruction data "MOVL C001FRG=1" indicates to execute linear interpolate (MOVL) by constituting a target attitude by each axis angle shown in index C001 and constituting an object of the interpolate control by the first flange side (FRG=1) In this case, the side of the first flange is subjected to the linear interpolate control by a total of 4 axes of the first axis, the second axis, the 3A axis, the 4A axis and the 3B axis, the 4B axis on the second flange side which are not designated are subjected to PTP control to the target angle.

Thereby, by executing the CP control for the flange on the side of taking out and inputting the work by using the robot as shown by FIG. 1, the work can accurately be carried and operation equivalent to that of 4 axes robot×2 units can be executed by the robot of 6 axes.

Although an explanation has been given here of the invention with regard to the most preferable embodiment in details to some degree, it is apparent that the explanation of the preferable embodiment can be modified with regard to a detailed portion of the constitution, or variously modified or changed to combinations of the modifications so far as the modifications are not against the spirit of the invention described in the scope of claims.

For example, although here, the robot having the two flanges are shown, even in the case of a robot mounted with three or more flanges by further adding axes, by selecting one flange there among to subject to CP control and subjecting the others to PTP control, the same effect is achieved.

As described above, according to the invention, an arbitrary tool can be subjected to CP control by using one unit of the robot controlling the plurality of tools. Therefore, there is achieved an effect the same as that in simultaneously using a plurality of robots by one unit of the robot and therefore, the cycle time can be shortened and the working efficiency can be promoted.

Further, according to the invention, the robot may be constructed by the minimum axis constitution by reducing the number of axes by mounting two or more of tools to one unit of the robot and sharing portions of the axes and therefore, the robot can be made to be small-sized and light-weighted and the system at lower cost can be constructed.

INDUSTRIAL APPLICABILITY

The invention is useful as an articulated robot mounted with a plurality of tools by a single unit thereof and its control apparatus.

The invention claimed is:

1. An articulated robot comprising:
a plurality of tools at a single unit thereof sharing portions of axes and capable of attaching the tools respectively tips of a plurality of axes connected to the axes independently therefrom, and
a control apparatus for subjecting a designated one of the tools to an interpolate control while controlling a position thereof and subjecting the tool which is not designated to a uniform pay off control to instruct to an axis angle of a target position.

2. The control apparatus of an articulated robot according to claim 1, comprising:
an information acquiring member for acquiring information in correspondence with an angle of each axis as the target position;
a tool selecting member for selecting one of the plurality of tools as an object of the interpolate control while controlling the position or controlling the position and the attitude;
a passing point determining member for determining a passing point at which the selected tool is to be moved successively by the interpolate control;
an axis position determining member for determining each axis position for moving a control point of the selected tool to the determined passing point by an inverse conversion operation; and
an uniform pay off controlling member for subjecting the axis which is unrelated to moving the control point of the selected tool to the uniform pay off control to instruct to the axis angle of the target position.

3. The control apparatus of an articulated robot according to claim 2, further comprising:
a preventing member for preventing an operation instruction from being generated with regard to the axis which is unrelated to moving the control point of the selected tool.

4. An articulated robot comprising:
a plurality of tools at a single unit thereof sharing portions of axes and capable of attaching the tools respectively tips of a plurality of axes connected to the axes independently therefrom, and
a control apparatus for subjecting a designated one of the tools to an interpolate control while controlling a position and an attitude thereof and subjecting the tool which is not designated to a uniform pay off control to instruct to an axis angle of a target position.

* * * * *